(12) United States Patent
Ishii et al.

(10) Patent No.: US 8,159,833 B2
(45) Date of Patent: Apr. 17, 2012

(54) PRINTED CIRCUIT BOARD, METHOD FOR FORMING FRAME GROUND FOR PRINTED CIRCUIT BOARD, AND ELECTRONIC DEVICE

(75) Inventors: Norihiro Ishii, Akishima (JP); Kuniyasu Hosoda, Hanno (JP); Shinya Ainai, Misawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 538 days.

(21) Appl. No.: 12/392,789

(22) Filed: Feb. 25, 2009

(65) Prior Publication Data

US 2009/0219703 A1 Sep. 3, 2009

(30) Foreign Application Priority Data

Feb. 29, 2008 (JP) ................ 2008-050691

(51) Int. Cl.
*H05K 7/14* (2006.01)
*H01R 4/30* (2006.01)
(52) U.S. Cl. ......... 361/799; 361/753; 174/262; 174/263
(58) Field of Classification Search .............. 361/720, 361/736, 752, 753, 758, 789, 790, 792, 796, 361/797, 760, 809, 816, 818, 810; 174/254–266, 174/138 D, 138 G, 207, 520–524; 257/678, 257/686, 698, 70–6, 734, 773–777; 29/825–852
See application file for complete search history.

(56) References Cited

U.S. PATENT DOCUMENTS

| | | | | |
|---|---|---|---|---|
| 4,851,614 A | * | 7/1989 | Duncan, Jr. | 174/263 |
| 4,927,367 A | * | 5/1990 | Salvagno | 439/92 |
| 5,326,937 A | * | 7/1994 | Watanabe | 174/263 |
| 5,414,223 A | * | 5/1995 | Suski et al. | 174/262 |
| 5,420,378 A | * | 5/1995 | Estes et al. | 174/263 |
| 6,295,210 B1 | * | 9/2001 | Lanzone et al. | 361/799 |
| 6,369,333 B1 | * | 4/2002 | Yee | 174/261 |
| 6,994,586 B2 | * | 2/2006 | Kanehira | 439/564 |
| 7,088,591 B2 | * | 8/2006 | Kishimoto et al. | 361/753 |
| 7,378,794 B2 | * | 5/2008 | Kim | 313/582 |

FOREIGN PATENT DOCUMENTS

| | | | |
|---|---|---|---|
| CN | 200956411 Y | * | 10/2007 |
| JP | 362183153 A | * | 4/1987 |
| JP | 401007694 A | * | 1/1989 |
| JP | 03-132092 | | 6/1991 |
| JP | 06-164111 | | 6/1994 |
| JP | 08-204360 | | 8/1996 |
| JP | 09135071 A | * | 5/1997 |
| JP | 02003043942 A | * | 7/2001 |
| JP | 2001-251029 | | 9/2001 |
| JP | 2007-134407 | | 5/2007 |
| JP | 02007134407 A | * | 5/2007 |

OTHER PUBLICATIONS

Notice of Reasons for Rejection mailed by Japan Patent Office on Jun. 15, 2010 in the corresponding Japanese patent application No. 2008-050691. The First Office Action mailed by State Intellectual Property Office of the People's Republic of China on Mar. 9, 2010 in the corresponding to the Chinese Patent Application No. 200910126134.7.
Explanation of Non-English Language References.

* cited by examiner

*Primary Examiner* — Michail V Datskovskiy
(74) *Attorney, Agent, or Firm* — Knobbe, Martens, Olson & Bear, LLP

(57) ABSTRACT

According to one embodiment, there is provided a printed circuit board, including a frame ground portion in which conductor patterns are formed around a board-fixation hole, and a plurality of through-holes formed around the board-fixation hole in the frame ground portion.

7 Claims, 4 Drawing Sheets

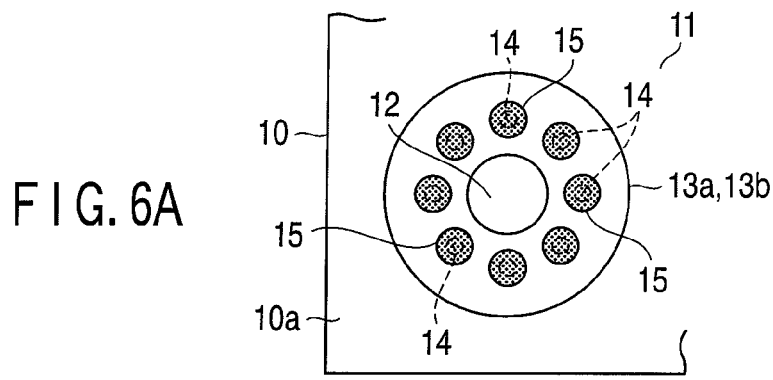
FIG. 6A
FIG. 6B
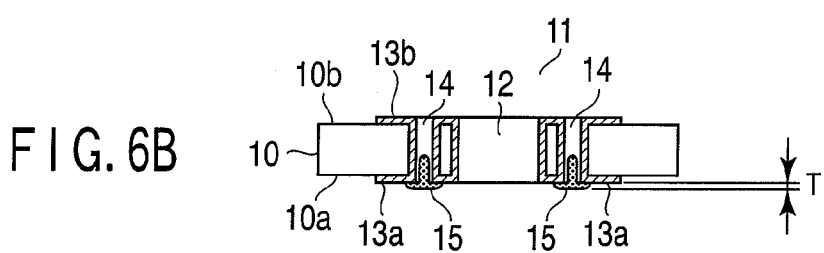
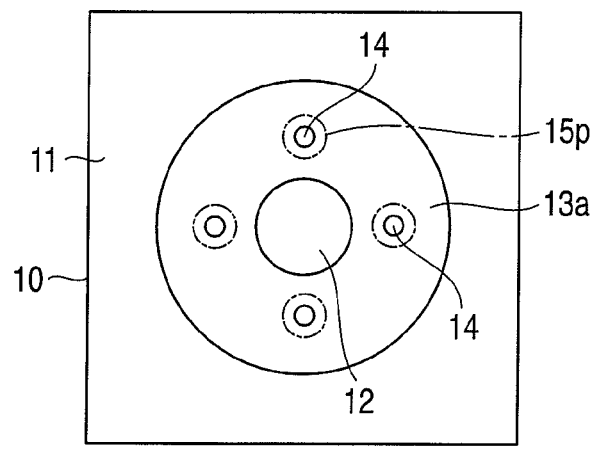
FIG. 7
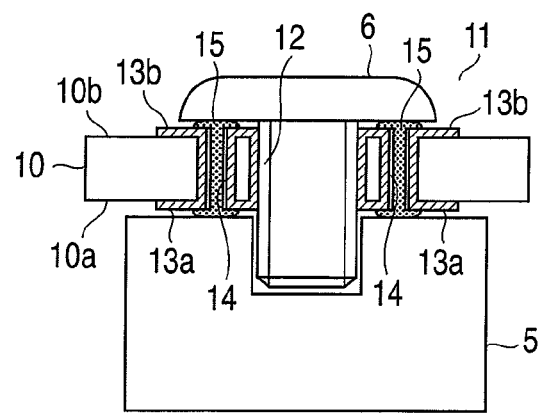
FIG. 8

PRINTED CIRCUIT BOARD, METHOD FOR FORMING FRAME GROUND FOR PRINTED CIRCUIT BOARD, AND ELECTRONIC DEVICE

CROSS-REFERENCE TO RELATED APPLICATIONS

This application is based upon and claims the benefit of priority from Japanese Patent Application No. 2008-050691, filed Feb. 29, 2008, the entire contents of which are incorporated herein by reference.

BACKGROUND

1. Field

One embodiment of the invention relates to a printed circuit board having a frame ground portion.

2. Description of the Related Art

In small electronic devices such as portable computers and personal digital assistants, which have electronic circuits incorporated in their housings, a frame ground (FG) for connecting the ground of the electronic circuit to a metal frame is an essential structural element. The ground of the electronic circuit determines reference for operating voltage, and functions as a return path for operating current. A weak frame ground may lead not only to instability of the reference voltage of the electronic circuit and unnecessary radiation but also to erroneous operation due to external noise or electrostatic discharge. In particular, the frame ground in which a copper foil pad is formed around a board-fixation hole requires frame ground technology in order to avoid ground connection failure caused by copper foil oxidation.

Heat treatment in normal surface mount technology (SMT) does not cause oxidation to such a degree that the copper foil pad of the frame ground is discolored. However, in conditions of high temperature heat as in baking, the copper foil pad of the frame ground tends to oxidize, leading to conduction failure of the frame ground. As a technology for preventing such conduction failure, gold plating of a pad surface is known. However, gold plating is expensive and hence increases manufacturing costs.

In Jpn. Pat. Appln. KOKAI Publication No. 2001-251029, another technology for preventing conduction failure caused by such oxidation is proposed. In this technology, a plurality of mounds of solder are applied to a copper foil land formed around the board-fixation hole of a frame ground and a screw is inserted in the hole so that the head of the screw is in contact with these mounds of solder, thereby maintaining a satisfactory ground connection in the frame ground.

However, the conventional frame ground technology in which mounds of solder are applied to a copper foil pad thickens the frame ground and discourages further reduction in size, especially in devices that require a lightweight, thin, and small design.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIGS. 6A and 6B show an exemplary manufacturing process of the main part of the printed circuit board according to the first embodiment;

FIG. 7 is an exemplary plan view of a modified example of the main part of the printed circuit board according to the first embodiment;

FIG. 8 is an exemplary side sectional view of another modified example of the main part of the printed circuit board according to the first embodiment;

DETAILED DESCRIPTION

Various embodiments according to the invention will be described hereinafter with reference to the accompanying drawings. In general, according to one embodiment of the invention, there is provided a printed circuit board, comprising a frame ground portion in which conductor patterns are formed around a board-fixation hole, and a plurality of through-holes formed around the board-fixation hole in the frame ground portion.

The embodiments will be described using as an example a multilayer printed circuit board in which components are mounted on one side only.

Figure 1:
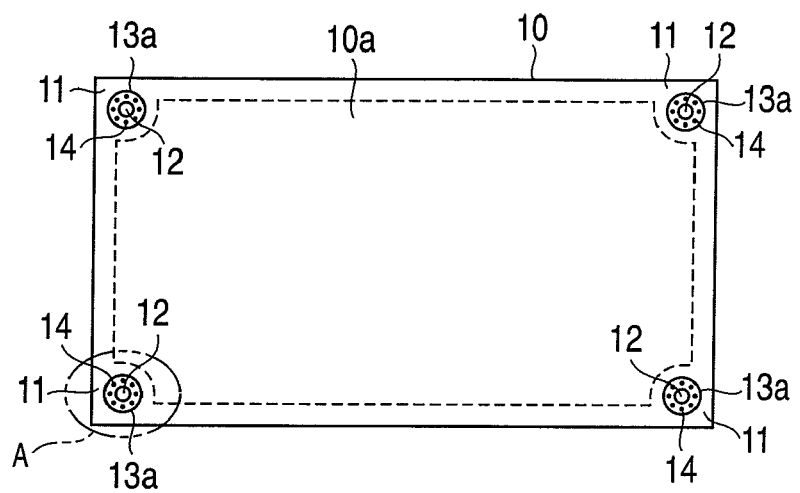
FIG. 1 is an exemplary plan view of the configuration of a main part of a printed circuit board according to a first embodiment of the invention.
Figure 2:
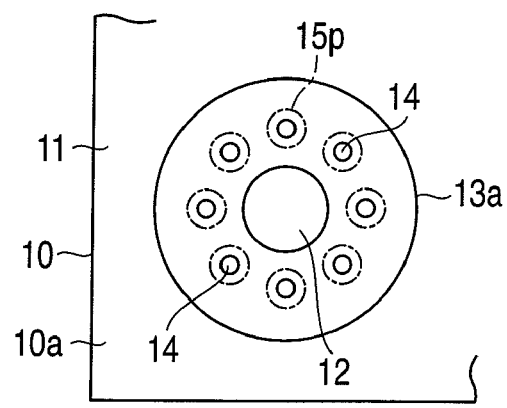
FIG. 2 is an exemplary enlarged plan view of a part of the printed circuit board according to the first embodiment.
Figure 3:
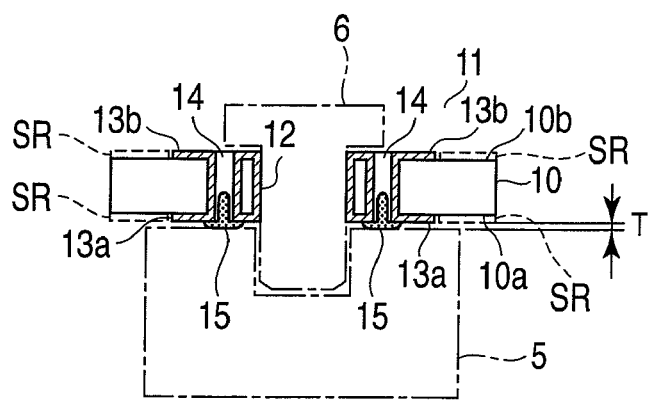
FIG. 3 is an exemplary enlarged sectional side view of a part of the printed circuit board according to the first embodiment.

FIGS. 1 to 3 show the configuration of a main part of the printed circuit board according to a first embodiment of the invention. FIG. 1 is a plan view of the configuration of the printed circuit board 10 according to the first embodiment of the invention. FIG. 2 is a plan view of the configuration of a frame ground portion 11, in an enlarged view of the part A of the printed circuit board 10. FIG. 3 is a side sectional view of the frame ground portion 11. In FIG. 1, the area surrounded by the broken line is a component mounting area, where surface components are mounted in a surface mount technology (SMT) process described below.

The printed circuit board 10 according to the first embodiment of the invention shown in FIGS. 1 to 3 includes the frame ground portions 11 which conductively connects the ground of an electronic circuit constructed using the printed circuit board 10 to a metal frame 5 disposed in a housing that supports the printed circuit board 10 fixed in position. The first embodiment shown in FIG. 1 has a layout in which the frame ground portion 11 is disposed in each of the corners (four) of the rectangular printed circuit board 10.

Each of the frame ground portions 11 includes a board-fixation hole 12 for use in member fixation, conductor patterns 13a and 13b formed on both sides (i.e., both surface layers) around the board-fixation hole 12, and a plurality of through-holes 14 formed around the board-fixation hole 12.

The board-fixation hole 12 is a large-diameter through-hole conductively connecting the conductor patterns 13a and 13b. This board-fixation hole 12 is a through-hole for a fastening screw 6, for example, which is a fixing member for fixing the printed circuit board (i.e., a printed circuit board with all components mounted) 10 to the metal frame disposed in the housing. Instead of the fastening screw, a metal lock pin, the head of which is elastically deformable, caulking pin, or the like is also applicable as a fixing member fitted into the board-fixation hole 12.

In the first embodiment, each of the conductor patterns 13a and 13b around the board-fixation hole 12 is formed of a copper foil pattern as a land specific to the frame ground portion 11, and the copper foil pattern is hereinafter referred to as a copper foil land. In the first embodiment, the copper foil lands 13a and 13b are circular patterns of the same diameter, which are formed on one side 10a and the other side 10b, respectively, of the printed circuit board 10. The copper foil land 13a is formed on the one face 10a which is the component mounting face, and the copper foil land 13b is formed on the other face 10b. The copper foil lands 13a and 13b on the one side 10a and the other side 10b, respectively, of the printed circuit board 10 are conductively connected integrally via the large-diameter through-hole serving as the board-fixation hole 12. The through-hole, or the board-fixation hole 12, is conductively connected to a ground pattern in an inner layer (not shown). Formed around the copper foil lands 13a and 13b on the one side 10a and the other side 10b of the printed circuit board 10, respectively, are solder resist films. The solder resist films SR are shown only in FIG. 3, and omitted in FIGS. 1 and 2.

In each of the frame ground portions 11, a plurality of through-holes 14 that are smaller in diameter than the board-fixation hole 12 formed of the large-diameter through-hole are formed in the copper foil lands 13a and 13b around the board-fixation hole 12.

In an assembling process performed later, these through-holes 14 serve as entry channels, through which part of a conductive-film forming member is introduced. The conductive-film forming member is used to form a conductive film, which prevents oxidation of the copper foil land 13a, onto the copper foil land 13a on the component mounting face side in contact with the metal frame 5. For the conductive-film forming member, cream solder, thermosetting conductive paste (e.g., silver paste), or the like, which can be supplied in a printing process in the SMT process, can be used.

In the first embodiment, cream solder is used as the conductive-film forming member. In a re-flow process described below, the through-holes 14 act as entry channels, through which some of the molten solder 15s is introduced. In the first embodiment, the solder supplied to the copper foil land 13a is represented by reference number 15p, the solder melted in the re-flow process (also called molten solder) is represented by reference number 15s, and solidified solder or solder film is represented by reference number 15.

As described above, forming a plurality of through-holes 14 serving as entry channels for molten solder 15s in the copper foil lands 13a and 13b of each of the frame ground portions yields the following advantages: the quantity of solder 15 covering the copper foil land 13a on the component mounting face side joined to the metal frame 5 in the assembling process performed later is regulated by the solder flowing in the through-holes 14 and is reduced to a small value (minimum amount), and extra solder (excess solder) flows into the through-holes 14 and is absorbed by the through-holes 14.

The flow of the excess solder into the through-holes 14 minimizes the thickness T of the layer of solder 15 covering the copper foil land 13a, as shown in FIG. 3.

Thus, while a solder film for preventing oxidation is formed on the copper foil land 13a, the volume of solder applied to the frame ground portion 11 can be reduced and the thickness of the frame ground portion 11 can be minimized.

The process of forming the frame ground portions 11 described above will now be described with reference to FIGS. 4A, 4B, 5A, 5B, 6A and 6B.

Figure 4A:
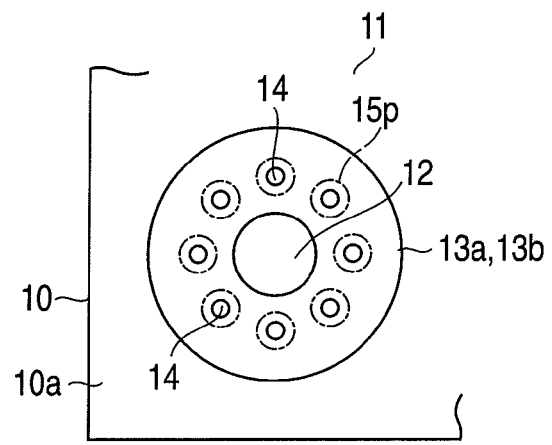
FIGS. 4A and 4B show an exemplary manufacturing process of a main part of the printed circuit board according to the first embodiment.
Figure 4B:
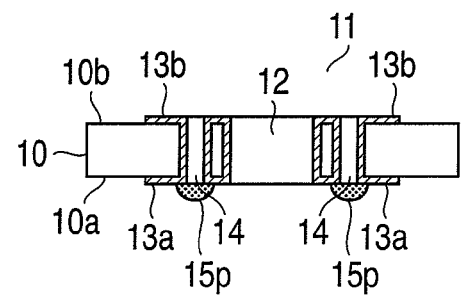
Figure 5A:
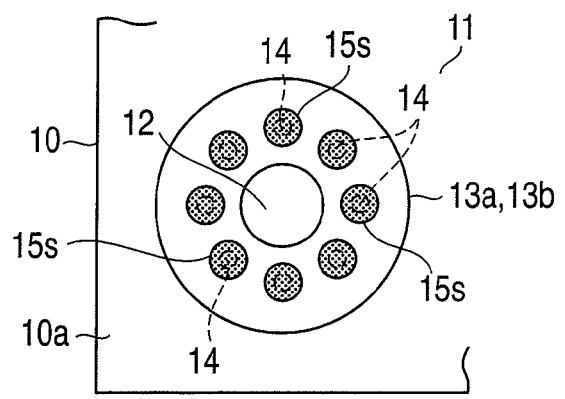
FIGS. 5A and 5B show an exemplary manufacturing process of the main part of the printed circuit board according to the first embodiment.
Figure 5B:
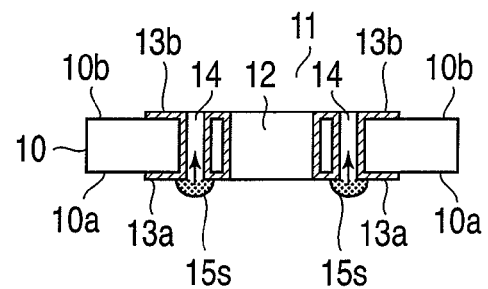

In a component mounting process based on the SMT, surface components are mounted in the component mounting area surrounded by the broken line shown in FIG. 1. The cream solder printing in the component mounting process by the SMT includes supplying cream solder 15p over the through-holes 14 of the copper foil land 13a of each of the frame ground portions 11, as shown in FIGS. 4A and 4B.

The cream solder is supplied over the through-holes 14 of the copper foil land 13a and over component mounting positions in the component mounting area. In the solder re-flow process after the surface components are mounted in the component mounting area, the cream solder supplied to the component mounting area melts and consequently the components (i.e., surface components) mounted in the component mounting area are secured in this area by the solder joint. In this re-flow process, the cream solder 15p printed on the through-holes 14 of the copper foil land 13a melts. This molten solder 15s covers the through-holes 14 and the peripheries of the through-holes 14 and also flows into the through-holes 14.

After the re-flow process, the solder solidifies and the surface components are secured in the component mounting area of the printed circuit board 10 by the solder joint, while, as shown in FIGS. 6A and 6B, the solder 15 supplied over the through-holes 14 covers the copper foil land 13a in the state where some of the solder 15 is in the through-hole 13. Consequently, a solder film 15 is formed around each of the through-holes 14 on the copper foil land 13a.

Thus, by forming a plurality of through-holes 14 serving as holes into which the molten solder 15s flows in the copper lands 13a and 13b of the frame ground 11, the quantity of solder 15 covering the copper foil land 13a is regulated and reduced by the solder flowing in the through-holes. Accordingly, since the excess solder flows into the through-holes 14 and is absorbed by them, the thickness T of the layer of solder 15 covering the copper foil land 13a can be minimized. This results in forming a solder film to prevent oxidation while reducing the volume of the solder applied to the frame ground portion 11, and minimize the thickness of the frame ground portion 11.

The thickness T of the layer of solder 15 covering the copper foil land 13a is determined by various factors, such as the number and the diameter of the through-holes 14, the characteristics and quantity of the solder to be supplied, re-flow heating temperature, and heating time. However, in the case of re-flow process in which the heating temperature, heating time, quantity of solder to be supplied, etc., are constant, the thickness T of the solder film 15 can be adjusted in accordance with the number and the diameter of the through-holes 14 and the amount of solder to be supplied as parameters.

The foregoing first embodiment exemplifies a configuration where each of the frame ground portions 11 includes eight through-holes 14 around the board-fixation hole 12. However, the position and the number of the through-holes 14 can be set as necessary. For example, four through-holes 14 may be formed around the board-fixation hole 12, as shown in FIG. 7.

In addition, the first embodiment exemplifies the case where some of the solder flows into the through-hole 14 on the copper foil land 13a side. However, for example, solder films 15 may be formed on both the copper foil lands 13a and 13b by adjusting the amount of solder to be supplied and the diameter of the through-holes 14, thereby filling the through-holes 14 as shown in FIG. 8.

Figure 9:
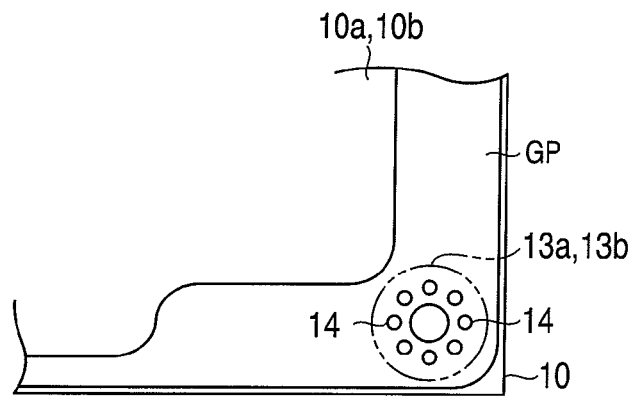
FIG. 9 is an exemplary plan view of another modified example of the main part of the printed circuit board according to the first embodiment.
Figure 10:
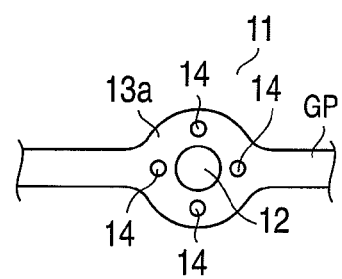
FIG. 10 is an exemplary plan view of another modified example of the main part of the printed circuit board according to the first embodiment.

Further, the first embodiment exemplifies the case where the copper foil lands 13a and 13b of each of the frame ground portions 11 are independent circular copper foil patterns. However, the copper foil lands 13a and 13b may be formed integrally with the ground pattern GP formed on the surface layer 10a (or 10b), as shown in FIGS. 9 and 10.

Figure 11:
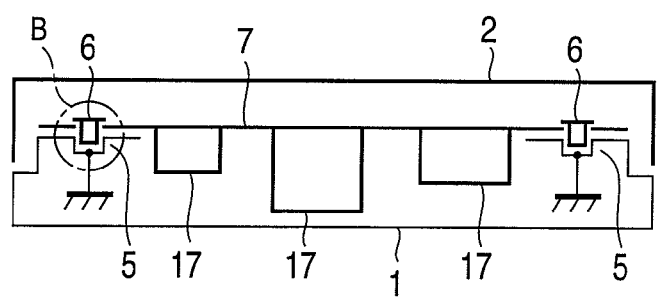
FIG. 11 is an exemplary plan view of the configuration of an electronic device according to a second embodiment of the invention.
Figure 12:
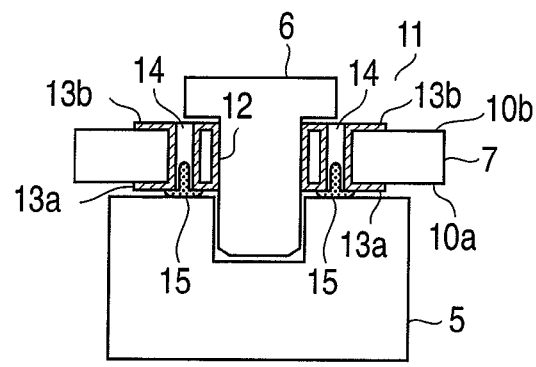
FIG. 12 is an exemplary plan view of the configuration of a main part of a printed circuit board according to the second embodiment.

Referring to FIGS. 11 and 12, next will be described a second embodiment of the invention. In the second embodiment, an electronic device is constructed using the printed circuit board that has the frame ground structure of the first embodiment described above. As shown in FIG. 11, the electronic device in the second embodiment includes a housing 1 having a metal frame 5, a cover 2, and a printed circuit board 7 fixed and supported on the metal frame 5 of the housing 1 with a fastening screw 6.

The printed circuit board 7 is constructed using the printed circuit board 10 described in the first embodiment described above, and includes a plurality of electronic components 17 mounted in the component mounting area of the component mounting face 10a. As shown in FIG. 12, which is an enlarged view of a part (part B) of the printed circuit board 7, this circuit board 7 includes a frame ground portion 11 that conductively connects the ground of the printed circuit board 7 to the metal frame 5 disposed in the housing 1.

The frame ground portion 11 includes a board-fixation hole 12, copper foil lands 13a and 13b formed on both sides (i.e., both surface layers) around the board-fixation hole 12, and a plurality of through-holes 14 arranged around the board-fixation hole 12.

The board-fixation hole 12 is a large-diameter through-hole that conductively connects the copper foil lands 13a and 13b, and serves as a through-hole for the fastening screw 6 used to fix the printed circuit board 7 to the metal frame 5 of the housing 1. The board-fixation hole 12 is conductively connected to the ground pattern in an inner layer.

The through-holes 14 are entry channels, into which some of the molten solder 15 supplied to the copper foil land 13a flows. Some of the solder 15 enters the through-holes 14, and thus the solder film 15 is formed in and on the copper foil land 13a around the through-holes 14.

Thus, by forming a plurality of through-holes 14 serving as holes into which the molten solder 15s flows are formed in each of the frame ground portions 11, the amount of solder 15 covering the copper foil land 13a on the component mounting face joined to the metal frame 5 is regulated and reduced by the solder flowing in the through-holes 14. This minimizes the thickness of the layer of solder 15 covering the copper foil land 13a. Thus, while a solder film that prevents oxidation is formed on the copper foil land 13a, the volume of the solder applied to the frame ground portion 11 is reduced and the thickness of the frame ground portion 11 can be minimized. This contributes to reduction in the thickness of the device while maintaining a satisfactory frame ground connection.

The first and second embodiments of the invention described above in detail can accordingly provide a printed circuit board in which the frame ground portions are thinner.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
    a board with a first face and a second face provided opposite to the first face, the board including a first through-hole;
    a conductor pattern portion formed at least on the second face and around the first through-hole of the board;
    a plurality of additional through-holes in addition to the first through-hole, the plurality of additional through-holes formed in the conductor pattern portion around the first through-hole of the board;
    a fixing member inserted through the first through-hole from a side of the first face of the board; and
    a conductive-film forming member in contact with the conductor pattern portion, part of the conductive-film forming member being introduced, from the second face of the board, partway into the additional through-holes.

2. The electronic device of claim 1, wherein the additional through-holes are entry channels for introducing part of the conductive-film forming member.

3. The electronic device of claim 2, wherein the conductive-film forming member is formed by cream solder supplied onto the conductor pattern portion and melted, and further wherein molten solder resulting from melting the cream solder is partway introduced to the additional through-holes and is covering a portion of the additional through-holes and the conductor pattern portion, thereby forming a solder film.

4. The electronic device of claim 3, wherein the solder film forms a joint which conductively joins a metal frame fixed by the fixing member inserted through the first through-hole.

5. The electronic device of claim 3, further comprising solder films on portions of the conductor pattern portion formed from molten solder flowing into the additional through-holes.

6. The electronic device of claim 4, wherein the conductor pattern portion on which the solder film is formed comprises a copper foil land.

7. The electronic device of claim 4, wherein the conductor pattern portion on which the solder film is formed comprises a part of a ground pattern.

* * * * *